United States Patent
Uchida

(10) Patent No.: US 6,958,488 B2
(45) Date of Patent: Oct. 25, 2005

(54) ORGANIC EL LIGHT EMITTING DEVICE AND ELECTRONIC APPARATUS

(75) Inventor: Masahiro Uchida, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/095,702

(22) Filed: Mar. 13, 2002

(65) Prior Publication Data

US 2002/0149009 A1 Oct. 17, 2002

(30) Foreign Application Priority Data

Mar. 16, 2001 (JP) ........................................ 2001-076037
Feb. 12, 2002 (JP) ........................................ 2002-034715

(51) Int. Cl.[7] .............................................. H01L 35/24
(52) U.S. Cl. ........................... 257/40; 257/99; 313/506
(58) Field of Search ...................... 257/40, 99; 313/506; 362/31; 359/618

(56) References Cited

U.S. PATENT DOCUMENTS

| | | | | |
|---|---|---|---|---|
| 5,505,985 A | * | 4/1996 | Nakamura et al. | 427/66 |
| 5,917,280 A | * | 6/1999 | Burrows et al. | 313/506 |
| 6,293,683 B1 | * | 9/2001 | Okada | 362/31 |
| 6,332,690 B1 | * | 12/2001 | Murofushi | 362/31 |
| 6,447,133 B1 | * | 9/2002 | Eschke et al. | 362/31 |
| 6,535,190 B2 | * | 3/2003 | Evanicky | 345/88 |

* cited by examiner

*Primary Examiner*—Sara Crane
(74) *Attorney, Agent, or Firm*—Oliff & Berridge, PLC

(57) ABSTRACT

The invention provides an organic EL (electroluminescence) light emitting device that includes a plane emission-type first organic EL light emitter, and a side emission-type second organic EL light emitter. The first organic EL light emitter includes a glass substrate, and an ITO film, an organic layer, a cathode layer, and a sealing substrate, which are laminated on the back of the glass substrate. The second organic EL light emitter includes a glass substrate, and an ITO film, a luminescent layer, a cathode layer, and a sealing substrate, which are laminated on either of the front and back sides of the glass substrate. The outer surface of the second organic EL light emitter is covered with a high-reflectance mirror except a portion of the side of the glass substrate. An aperture of the second organic EL light emitter is disposed opposite to the side of the glass substrate of the first organic EL light emitter. Accordingly, the invention increases a quantity of light emitted from the first organic EL light emitter.

8 Claims, 4 Drawing Sheets

ORGANIC EL LIGHT EMITTING DEVICE AND ELECTRONIC APPARATUS

BACKGROUND OF THE INVENTION

1. Field of the Invention

The present invention relates to an organic EL (electroluminescence) light emitting device utilizing an organic EL element. More particularly, the present invention relates to an organic EL light emitting device having a construction suitable for securing a quantity of light.

2. Description of Related Art

Currently, organic EL light emitters each utilizing an organic EL element have already been brought into practical use as a display device, an illumination device, a back light for a liquid crystal display, etc.

An organic EL light emitter generally has a construction in which a transparent electrode, an organic layer and a cathode are laminated in this order on a surface of a transparent substrate. Accordingly, when a voltage is applied between the transparent electrode and the cathode to flow a current in the organic layer having a hole transport layer, a light emitting layer, an electron transport layer, etc., light is emitted from the light emitting layer. Part of the emitted light is transmitted through the transparent electrode and the transparent substrate in the thickness direction, and is radiated to the outside from the back side of the transparent substrate.

SUMMARY OF THE INVENTION

An organic EL light emitting device according to the present invention can include a first organic EL light emitter, and a second organic EL light emitter. The first organic EL light emitter and the second organic EL light emitter being arranged so that light emitted from the second organic EL light emitter is radiated to the outside through a substrate of the first organic EL light emitter.

An organic EL light emitting device according to the present invention can include a first organic EL light emitter having an organic EL element formed on a surface of a first substrate so that the radiation direction of light emitted from the organic EL element is the thickness direction of the first substrate, and a second organic EL light emitter having an organic EL element formed on a surface of a second substrate so that the radiation direction of light emitted from the organic EL element is the plane direction of the second substrate. The first organic EL light emitter and the second organic EL light emitter being arranged so that light emitted from the second organic EL light emitter and transmitted through the second substrate enters the first substrate and is radiated to the outside through the first substrate.

An electronic apparatus according to the present invention can include an organic EL light emitting device having a first organic EL light emitter, and a second organic EL light emitter. The first organic EL light emitter and the second organic EL light emitter being arranged so that light emitted from the second organic EL light emitter is radiated to the outside through a substrate of the first organic EL light emitter.

An electronic apparatus according to the present invention can include an organic EL light emitting device having a first organic EL light emitter comprising an organic EL element formed on a surface of a first substrate so that the radiation direction of light emitted from the organic EL element is the thickness direction of the first substrate, and a second organic EL light emitter comprising an organic EL element formed on a surface of a second substrate so that the radiation direction of light emitted from the organic EL element is the plane direction of the second substrate. The first organic EL light emitter and the second organic EL light emitter being arranged so that light emitted from the second organic EL light emitter and transmitted through the second substrate enters the first substrate and is radiated to the outside through the first substrate.

BRIEF DESCRIPTION OF THE DRAWINGS

The invention will be described with reference to the accompanying drawings, wherein like numerals represent like elements, and wherein.

DETAILED DESCRIPTION OF PREFERRED EMBODIMENTS

Figure 1:
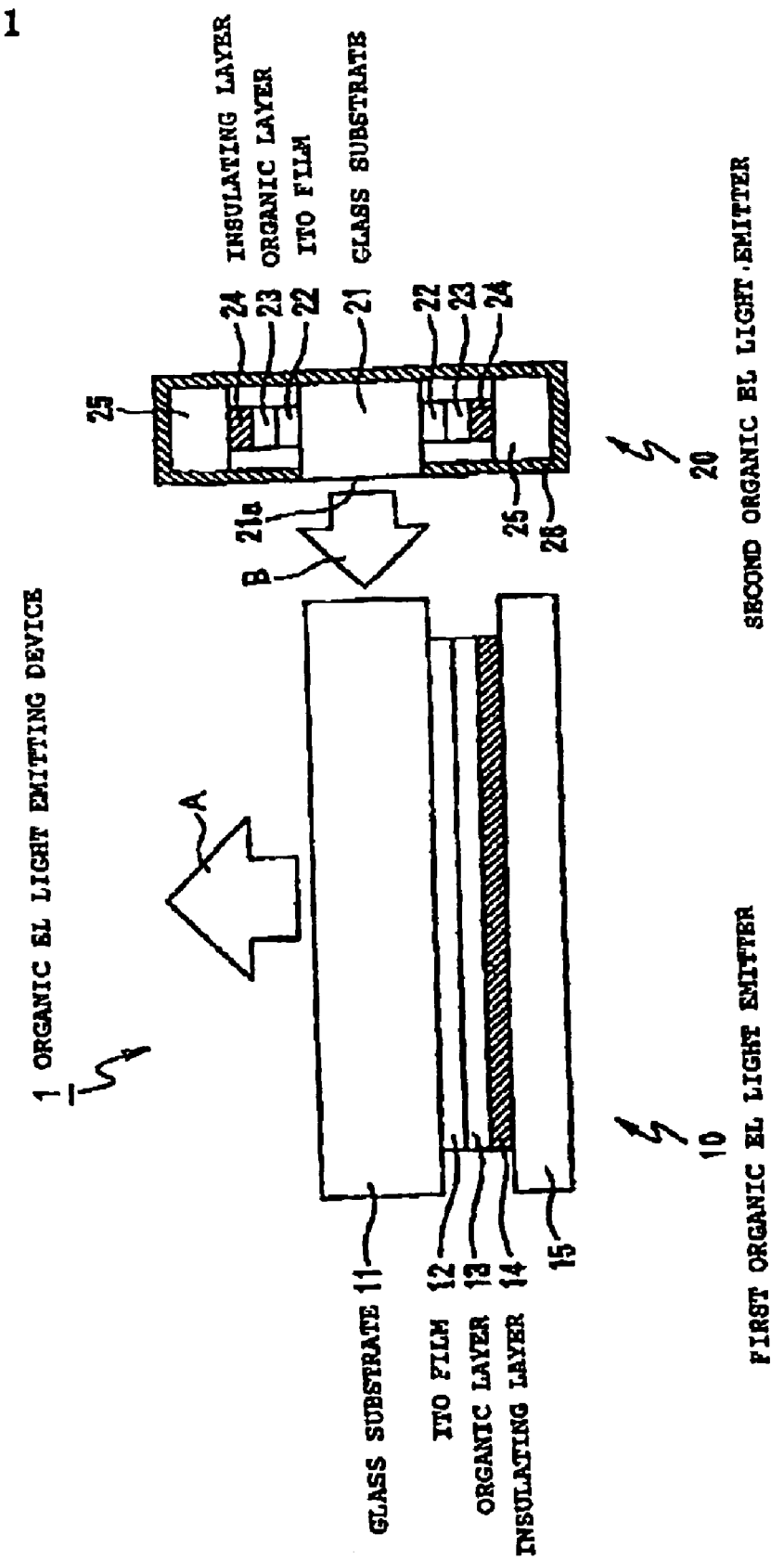
FIG. 1 is a sectional view showing a first embodiment of the present invention.

A conventional general organic EL light emitter has a construction in which part of the light emitted as described above and transmitted through a transparent substrate in the thickness direction is radiated to the outside. Therefore, possible measures for increasing the quantity of light per unit area include the measure of developing an organic material having high efficiency of light emission, the measure of increasing a voltage applied between a transparent electrode and a cathode to pass a great current, and the measure of selecting a material for the transparent substrate, or the like so as to decrease the attenuation factor in transmittance. However, of course, any one of the above-measures has a limitation.

In an embodiment of the present invention, in order to solve the problem of a conventional device, the present invention is aimed at providing a new construction of an organic EL light emitting device suitable for increasing the quantity of light per unit area.

An organic EL light emitting device according to an embodiment of the present invention can include a first organic EL light emitter, and a second organic EL light emitter. The first organic EL light emitter and the second organic EL light emitter being arranged so that light emitted from the second organic EL light emitter is radiated to the outside through a substrate of the first organic EL light emitter.

In this construction, the light emitted from the second organic EL light emitter is radiated to the outside through the substrate of the first organic EL light emitter. Therefore the quantity of light radiated to the outside through the first substrate corresponds to the sum of the light emitted from the first organic EL light emitter and the light omitted from the second organic EL emitter. Therefore, the quantity of light of the first organic EL light emitter is apparently increased.

An organic EL light emitting device according to another embodiment of the present invention can include a first organic EL light emitter having an organic EL element formed on a surface of a first substrate so that the radiation direction of light emitted from the organic EL element is the thickness direction of the first substrate, and a second organic EL light emitter having an organic EL element formed on a surface of a second substrate so that the radiation direction of light emitted from the organic EL element is the plane direction of the second substrate. The first organic EL light emitter and the second organic EL light emitter being arranged so that light emitted from the second organic EL light emitter and transmitted through the second substrate enters the first substrate and is radiated to the outside through the first substrate.

In this construction, the light emitted from the second organic EL light emitter is transmitted through the substrate thereof in the horizontal direction (the direction along the substrate), and enters the substrate of the first organic EL light emitter in the horizontal direction (the direction along the substrate).

The organic EL light emitting device can include a plurality of the second organic EL light emitters so that light emitted from each of the second organic EL light emitters enters the first substrate.

In this construction, light emitted from each of the second organic EL light emitters enters the substrate of the first organic EL light emitter. Therefore, the quantity of light radiated to the outside through the first substrate corresponds to the sum of the light emitted from the first organic EL light emitter and the light emitted from the plurality of the second organic EL emitters. Accordingly, the quantity of light of the first organic EL light emitter is apparently further increased.

In the organic EL light emitting device, the first organic EL light emitter can include organic EL elements formed on both the front and back surfaces of the first substrate, and at least one of the organic EL elements can have a transparent electrode, an organic layer and a transparent cathode, which are laminated in turn from the substrate side.

In this construction, the organic EL elements are formed on both sides of the first substrate, and at least one of the organic EL elements have the transparent cathode capable of transmitting light. Therefore, when the other organic El element includes a reflective cathode, light emitted from the organic EL element is radiated to the outside through the side on which the organic EL element having the transparent cathode is formed, further increasing the quantity of light. On the other hand, in the construction of the first organic EL light emitter in which both organic EL elements have transparent cathodes, light emitted from the second organic EL light emitter is added to apparently increase the quantity of emitted light, and the increased quantity of light is radiated to the outside from both sides of the first organic EL light emitter.

As the transparent electrode (transparent anode), ITO (In2O3-SnO2) can be used.

As the transparent cathode, a thin film formed by co-deposition of magnesium (Mg) and silver (Ag), a thin film formed by co-deposition of lithium (Li) and aluminum (Al), and the like can be used. Besides these films, a two-layer structure can be used as the structure of the transparent cathode, in which a thin film having a larger work function is formed on a thin film formed on the organic layer side. In this two-layer structure, calcium (Ca), magnesium (Mg), or the like can be used as the material for the thin film on the organic layer side, and aluminum (Al), silver (Ag), gold (Au), or the like can be used as the material for the other thin film.

In the organic EL light emitting device, the second organic EL light emitter can include the organic EL elements formed on the front and back sides of the second substrate.

In this construction, the organic EL elements can be formed on both sides of the substrate of the second organic EL light emitter, and thus the quantity of light emitted from the second organic EL light emitter is increased. Therefore, the emitted light in an increased quantity is radiated to the outside through the substrate of the first organic EL light emitter, thereby further increasing the apparent quantity of light emitted from the first organic EL light emitter.

In the organic EL light emitting device, the organic EL elements having different light emission colors may be used. In this construction, the organic EL elements have different light emission colors, and thus the light emission colors can be switched by selectively applying a voltage to the organic EL elements, apart from the case in which the organic EL elements having the same emission color are used. Particularly, when the light's three primary colors, red (R), green (G), and blue (B), are provided as the light emission colors, various colors can be developed. Furthermore, if the quantities of the lights emitted can be changed by changing the magnitude of the applied voltage, more colors can be developed.

In the organic EL light emitting device, the first substrate and the second substrate may be separately provided so that the sides thereof are opposed to each other.

In this construction, light emitted from the second organic EL light emitter and transmitted horizontally through the substrate is radiated from the side of the substrate of the second organic EL light emitter, and then enters the substrate of the first organic EL light emitter from the side thereof.

In this organic EL light emitting device, a common substrate may be used as the first substrate and the second substrate.

In this construction, a portion of the common substrate constitutes the substrate of the first organic EL light emitter, and another portion of the common substrate constitutes the substrate of the second organic EL light emitter. Therefore, both substrates are continued, and thus light emitted from the second organic EL light emitter and transmitted horizontally through the substrate enters directly the substrate of the first organic EL light emitter. Then, the light entering the first substrate from the second substrate is repeatedly scattered and reflected in the first substrate, and then radiated to the outside through the first substrate. Accordingly, the quantity of the light radiated to the outside through the first substrate corresponds to the sum of the light emitted from the first organic EL light emitter and the light emitted from the second organic EL light emitter. Therefore, the quantity of the light emitted from the first organic EL light emitter is apparently increased.

An electronic apparatus according to still another embodiment of the present invention can include an organic EL light emitting device having a first organic EL light emitter, and a second organic EL light emitter, the first organic EL light emitter and the second organic EL light emitter being arranged so that light emitted from the second organic EL light emitter is radiated to the outside through a substrate of the first organic EL light emitter.

An electronic apparatus according to a further embodiment of the present invention can include an organic EL light emitting device having a first organic EL light emitter that includes an organic EL element formed on a surface of a first substrate so that the radiation direction of light emitted from the organic EL element is the thickness direction of the first substrate. The device can also include a second organic EL light emitter having an organic EL element formed on a surface of a second substrate so that the radiation direction of light emitted from the organic EL element is the plane direction of the second substrate. The first organic EL light emitter and the second organic EL light emitter being arranged so that light emitted from the second organic EL light emitter and transmitted through the second substrate enters the first substrate and is radiated to the outside through the first substrate.

Preferred embodiments of the present invention will be described below with reference to the drawings.

FIG. 1 is a sectional view showing the entire construction of an organic EL light emitting device 1 according to a first embodiment of the present invention.

The organic EL light emitting device 1 can include a plane emission-type first organic EL light emitter 10, and a side emission-type second organic EL light emitter 20. In FIG. 1, the plane emission-type first organic EL light emitter 10 and a side emission-type second organic EL light emitter 20 are spaced having a relatively large distance therebetween for the sake of convenience of drawing and description. However, both light emitters 10 and 20 are actually disposed so that the sides of the transparent substrates described below are opposed to each other with no space therebetween.

The first organic EL light emitter 10 includes a glass substrate 11 as the first transparent substrate, and an ITO film 12 serving as an anode, an organic layer 13, a cathode layer 14 having a co-deposited film of Mg and Ag (ratio, Mg:Ag= 10:1), and a sealing substrate 15, which are laminated in that order on the back of the glass substrate 11. Of these layers, the ITO film 12, the organic layer 13 and the cathode layer 14 constitute an organic EL light unit.

The organic layer 13 includes a laminate of a hole transport layer, a light emitting layer, an electron transport layer, etc. so that a current flows in the lamination direction to emit light. These layers can be deposited by a method of vacuum evaporation, sputtering, spin coating, ink jet, or the like.

The sealing substrate 15 can be made of a transparent or translucent plate material such as soda glass, lead alkali glass, or the like.

Part of the light emitted from the organic layer 13 is transmitted through the ITO film 12 and the glass substrate 11, and radiated as radiated light A to the outside from the surface of the glass substrate 11. Another part of the emitted light is transmitted to the cathode 14, and reflected by the surface of the cathode layer 14 to travel to the ITO film 12. Therefore, the light is also radiated as radiated light A to the outside through the ITO film 12 and the glass substrate 11.

On the other hand, the second organic EL light emitter 20 can include a glass substrate 21 as the second transparent substrate, and an ITO film 22 serving as an anode, a light emitting layer 23, a cathode layer 24 having a co-deposited film of Mg and Ag, and a sealing substrate 25, which are laminated on the front and back sides of the glass substrate 21 in that order from the glass substrate side. Of these layers, the ITO film 22, the organic layer 23 and the cathode layer 24 constitute an organic EL element. The luminescent layer 23 also includes a laminate of a hole transport layer, a light emitting layer, an electron transport layer, etc. so that a current flows in the lamination direction to emit light. The sealing substrate 25 is made of the same material as the sealing substrate 15.

Furthermore, the outer surface of the second organic EL light emitter 20 except a portion of the side of the glass substrate 21 is covered with a high-reflectance mirror 26 having a high-reflectance metal film of silver, aluminum, or the like, a polyester film on which a high-reflectance metal film of silver, aluminum, or the like is deposited, or the like. The side of the glass substrate 21, which is not covered with the mirror 26, serves as an aperture 21a.

Therefore, of the light emitted from each of the organic EL elements provided on the front and back sides of the glass substrate 21, light traveling toward the outside of the second organic EL light emitter 20 is also reflected by the inner surface of the mirror 26 and collected in the glass substrate 21. The light collected in the glass substrate 21 is repeatedly reflected by each of the parts in the glass substrate 21, transmitted horizontally and then radiated as radiated light B to the outside from the aperture 21a.

The first organic EL light emitter 10 and the second organic EL light emitter 20 are integrally contained in a case (not shown in the drawing) of the entire organic EL light emitting device 1. Both light emitters have a positional relationship in which the aperture 21a of the second organic EL light emitter 20 is opposed to the side of the glass substrate 11 of the first organic EL light emitter 10.

Therefore, the radiated light B emitted from the second organic EL light emitter 20 and radiated to the outside from the aperture 21a enters the glass substrate 11 of the first organic EL light emitter 10 through the side thereof, and is reflected by the surfaces of the cathode layer 14, etc. of the first organic EL light emitter 10, and then radiated as the radiated light A to the outside through the glass substrate 11.

Namely, in the construction of this embodiment, the radiated light A corresponds to the sum of the light emitted from the first organic EL light emitter 10 and the light emitted from the second organic EL light emitter 20. Therefore, the quantity of the radiated light A, can be increased as compared with the light emitted from the first organic EL light emitter 10.

In the construction of this embodiment, light is not necessarily simultaneously emitted from the first organic EL light emitter 10 and the second organic EL light emitter 20. For example, another construction may be used, in which the organic EL element of the first organic EL light emitter 10 is patterned so that a character, a figure or the like can be displayed, and the second organic EL light emitter 20 includes the organic layer 23 which can emit light, for example, of red, blue, or the like, not white, so that a display can be performed by switching a mode for displaying a character by emitting light only from the first organic EL light emitter 10, and a mode for coloring the entire glass substrate 11 by emitting light only from the second organic EL light emitter 20. This is suitable for achieving various presentations. These modes can be alternately switched with a very short period to display a character of another color in a blue light emitted from the entire glass substrate 11.

Figure 2:
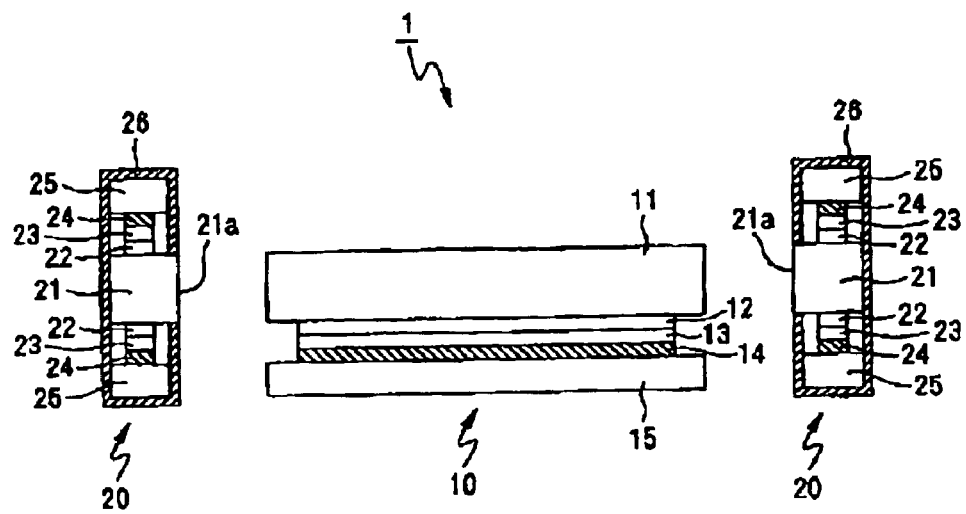
FIG. 2 is a sectional view showing a second embodiment of the present invention.

FIG. 2 is a sectional view showing the entire construction of an organic EL light emitting device 1 according to a second embodiment of the present invention. The same portions as the first embodiment are denoted by the same reference numerals, and a duplicated description is thus omitted.

Namely, this embodiment can include a plurality (two) of second organic EL light emitters 20 so that light radiated from the aperture 21a of each of the second organic EL light emitters 20 is incident on the side of the glass substrate 11 of the first organic EL light emitter 10.

In the construction of this embodiment, the quantity of light radiated from the surface of the first organic EL light emitter 10 can be further increased, as compared with the first embodiment.

Figure 3:
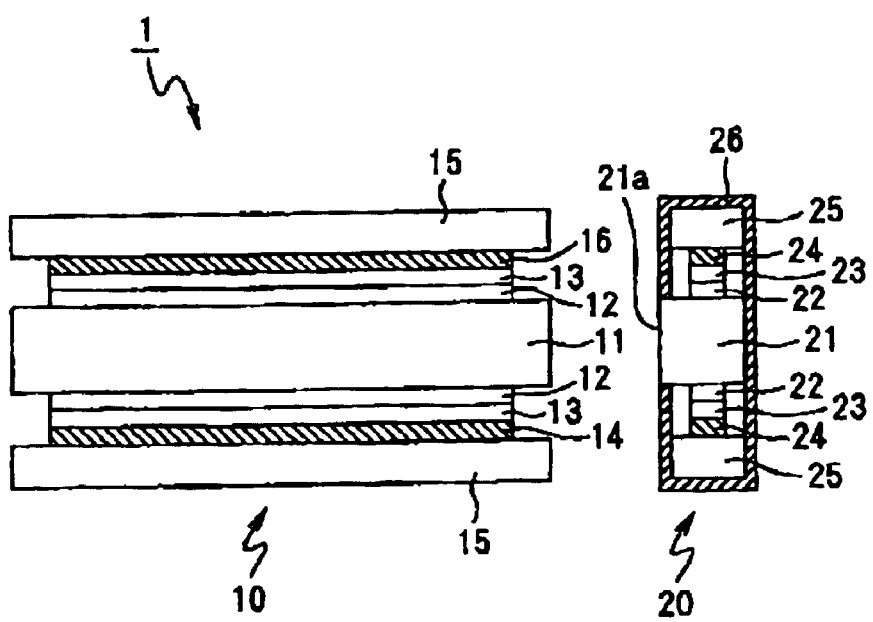
FIG. 3 is a sectional view showing a third embodiment of the present invention.

FIG. 3 is a sectional view showing the entire construction of an organic EL light emitting device 1 according to a third embodiment of the present invention. The same portions as each of the above-described embodiments are denoted by the same reference numerals, and a duplicated description is omitted.

Namely, in this embodiment, the first organic EL light emitter 10 can include organic EL elements formed on the front and back sides of the glass substrate 11. The organic EL element formed on the back side (the lower side shown in FIG. 3) of the glass substrate 11 includes a laminate of the ITO film 12, the organic layer 13, and the cathode layer 14, like in the first embodiment.

On the other hand, the organic EL element formed on the front side (the upper side shown in FIG. 3) of the glass substrate 11 can include a laminate of the ITO film 12, the organic layer 13 and a transparent cathode 16. As the material for forming the transparent cathode 16, a two-layer structure material can be used. Of the two layers of the transparent cathode 16, a thin film in contact with the organic layer 13 is formed by using calcium (Ca) as a material, and the other thin film is formed by using gold (Au) as a material. The transparent cathode 16 has a total thickness of about 150 Å to secure transparency without losing conductivity. The transparent cathode 16 may include a co-deposited film of Mg and Ag having a thickness of about 100 Å.

In this construction, light radiated to the outside from the front side of the first organic EL light emitter 10 corresponds to the sum of light emitted from the organic EL element formed on the back side of the glass substrate 11 of the first organic EL light emitter 10, light emitted from the organic EL element formed on the front side of the glass substrate 11 of the first organic EL light emitter 10, and light emitted from the second organic EL light emitter 20, thereby further increasing the quantity of light radiated from the surface of the first organic light emitter 10, as compared with the first embodiment.

Figure 4:
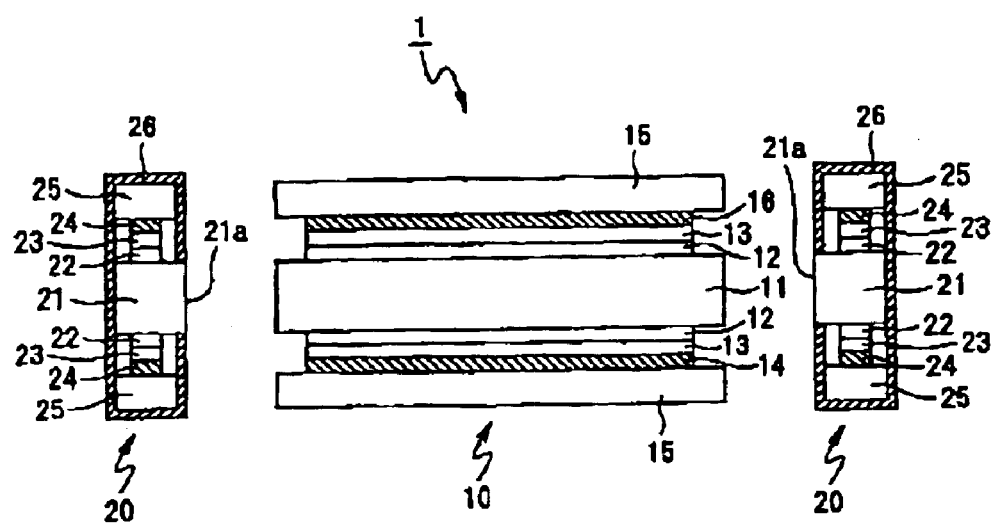
FIG. 4 is a sectional view showing a fourth embodiment of the present invention.

FIG. 4 is a sectional view showing the entire construction of an organic EL light emitting device 1 according to a fourth embodiment of the present invention. The same portions as each of the above-described embodiments are denoted by the same reference numerals, and a duplicated description is omitted.

Namely, the organic EL light emitting device 1 of this embodiment has a combination of the constructions of the second and third embodiments, in which the organic EL light emitter 10 includes organic EL elements formed on the front and back sides of the glass substrate 11, and a plurality of second organic EL light emitters 20 are provided.

Furthermore, the organic EL emitters contained in the organic EL light emitting device 1 are caused to emit lights of different colors in such a manner that the organic EL element provided on the front side of the glass substrate 11 of the first organic EL light emitter 10 emits red (R) light, the organic EL element provided on the back side of the glass substrate 11 of the first organic EL light emitter 10 emits green (G) light, and the organic EL elements provided on the second organic EL light emitter 20 emit blue (B) light. Particularly, in this embodiment, the light's three primary colors, red, green and blue, are used as emitted light colors.

In this construction, the quantity of light radiated from the surface of the first organic EL light emitter 10 can be further increased, and the color of the radiated light can be controlled by selecting the light emission conditions of each of the organic EL elements.

Therefore, the organic EL light elements 1 of this embodiment are arranged in a matrix, and a driver circuit is provided to separately emit light from the respective organic EL light emitting elements 1 so that a color display having the organic EL light emitting elements 1 as pixels can be formed. Particularly, a large color display, which generally uses light-emitting diodes, can also be formed.

Figure 5:
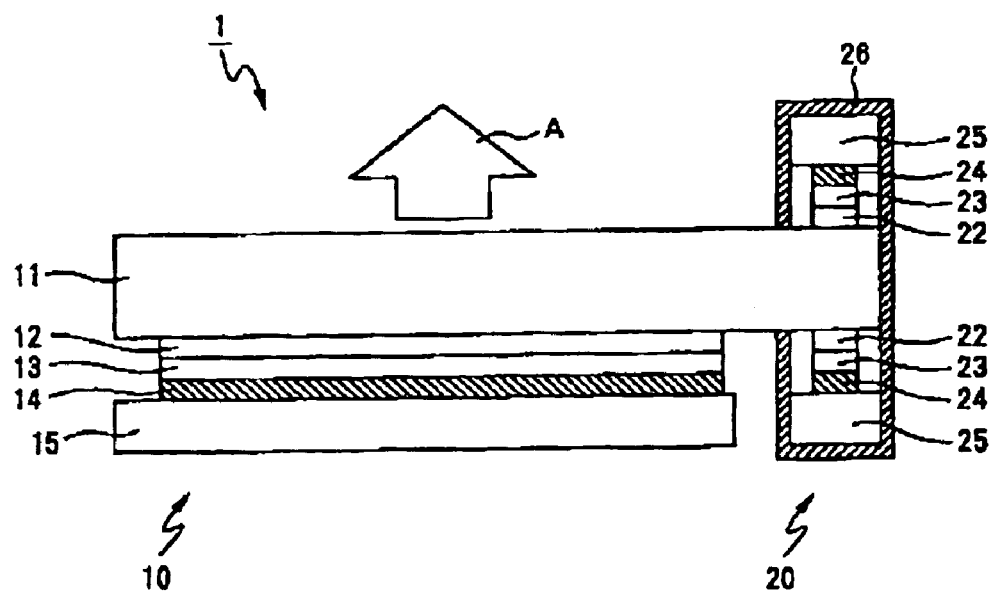
FIG. 5 is a sectional view showing a fifth embodiment of the present invention.

FIG. 5 is a sectional view showing the entire construction of an organic EL light emitting device 1 according to a fifth embodiment of the present invention. The same portions as each of the above-described embodiments are denoted by the same reference numerals, and a duplicated description thereof is omitted.

In the first to fourth embodiments, the glass substrate 11 of the first organic EL light emitter 10 and the glass substrate 21 of the second organic EL light emitter 20 are separately provided. However, in the fifth embodiment, a common glass substrate 11 can be used for the first organic EL light emitter 10 and the second organic EL light emitter 20. In other words, the glass substrate 11 of the first organic EL light emitter 10 is slightly widened so that the end portion of the glass substrate 11 is used for the second organic EL light emitter 20. In this case, each of the organic EL emitters are preferably formed by a method, such as an ink jet method, capable of easily patterning.

In this construction, light emitted from the second organic EL light emitter 20 is repeatedly reflected by the cathode layers 24, and the mirror 26, transmitted horizontally through the glass substrate 11 to enter the first organic EL light emitter 10 side, and radiated as radiated light A to the outside from the surface of the glass substrate 11, thereby increasing the quantity of light radiated from the surface of the first organic EL light emitter 10, similarly to the first embodiment.

In the construction of this embodiment, the glass substrate 11 is common to the fist organic EL light emitter 10 and the second organic EL light emitter 20 so that light emitted from the second organic EL light emitter 20 enters the glass substrate 11 of the first organic EL light emitter 10 without being radiated to the outside. Therefore, a loss can be maintained low during transmission of light from the glass substrate side of the second organic EL light emitter 20 to the glass substrate 11 side of the first organic EL light emitter 10, thereby causing the advantage of contribution to the securement of the quantity of the radiated light A.

Although, in each of the above embodiments, the second organic EL light emitter 20 includes the organic EL elements formed on the front and back sides of the glass substrate 21, it should be understood that the construction is not limited to this, and an organic EL element may be formed only on one of both sides.

Although, in the second and fourth embodiments, the two second organic EL light emitters 20 are provided, it should be understood that the number of the second organic EL light emitters provided is not limited to this, and at least three second organic EL light emitters 20 may be provided.

Although, in the fourth embodiment, only the organic EL element provided on the front side of the glass substrate 11 of the first organic EL light emitter 10 comprises the transparent electrode 16, it should be understood that the construction is not limited to this. For example, each of the organic EL elements provided on the front and back sides of the glass substrate 11 may include the transparent electrode 16 so that light is radiated to the outside from both sides of the glass substrate 11 (the lower side of the glass substrate 11 is transparent).

It should be readily apparent that the organic EL light emitting device of the present invention can be applied to various electronic apparatuses, for example, such as a mobile personal computer, a cell phone, a digital camera, etc.

Figure 6:
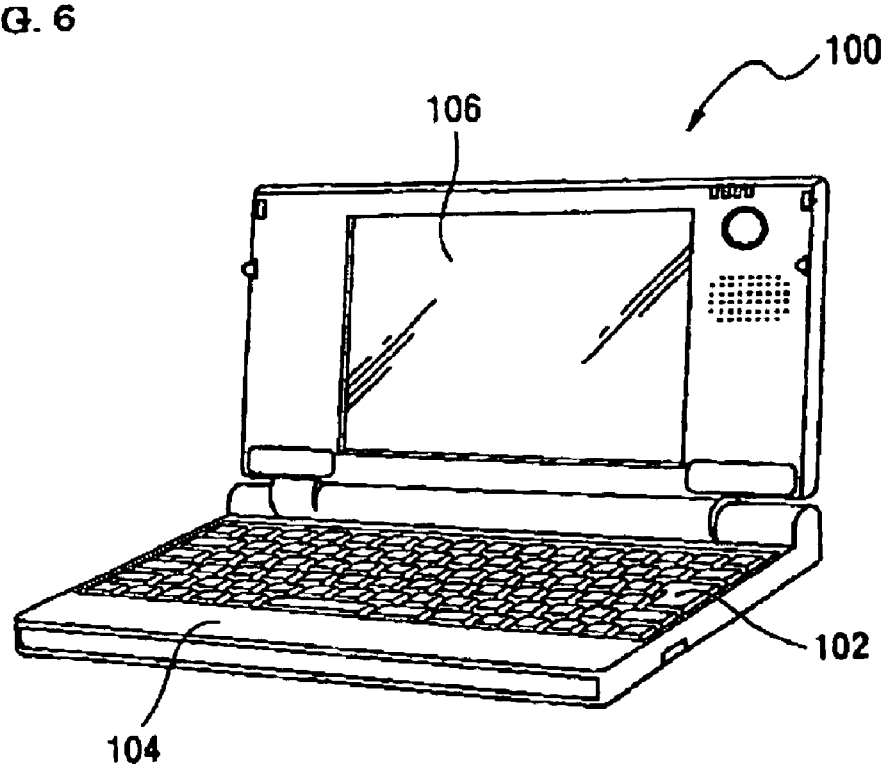
FIG. 6 is a perspective view showing the configuration of a personal computer as an example of an electronic apparatus to which an organic EL emitting device of the present invention is applied.

FIG. 6 is a perspective view showing the construction of a mobile personal computer. In FIG. 6, a personal computer 100 includes a body 104 having a keyboard 102, and a display unit 106 including the organic EL light emitting device of the present invention.

Figure 7:
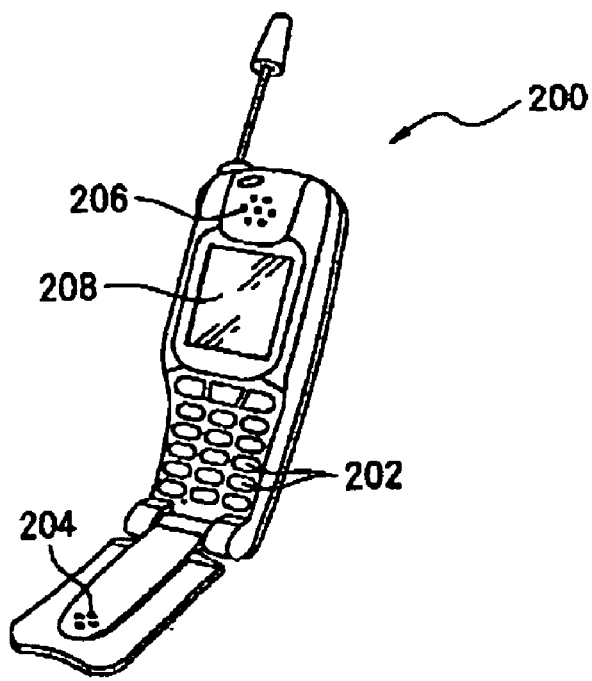
FIG. 7 is a perspective view showing the configuration of a cell phone as an example of an electronic apparatus to which an organic EL emitting device of the present invention is applied.

FIG. 7 is a perspective view of a cell phone. In FIG. 7, a cell phone 200 includes a plurality of operating buttons 202, an ear piece 204, and a mouth piece 206, as well as a display panel 208 having the organic EL light emitting device of the present invention.

Besides the personal computer shown in FIG. 6, and the cell phone shown in FIG. 7, the organic EL light emitting device of the present invention can be applied to display sections of electronic apparatuses such as a television, a view finder-type or monitor direct viewing-type video tape recorder, a car navigation device, a pager, an electronic notebook, an electric calculator, a word processor, a work station, a picture telephone, a POS terminal, an apparatus comprising a touch panel, and the like.

As described above, according to the present invention, a plane emission-type first organic EL light emitter and a side emission-type second organic EL light emitter are arranged so that light emitted from the second organic EL light emitter is transmitted through the transparent substrate of the second organic EL light emitter and then radiated to the outside through the transparent substrate of the first organic EL light emitter. Therefore, the present invention has the effect of apparently increasing the quantity of light emitted from the first organic EL light emitter.

What is claimed is:

1. An EL light emitting device, comprising:
    a substrate having a light emitting surface;
    a first EL light emitter that emits a first light, and having an EL element deposited on the substrate, the first light emitter being arranged such that the first light enters the substrate from a thickness direction of the light emitting surface; and
    a second EL light emitter that emits a second light, the second light emitter being arranged such that the second light enters the substrate from a plane direction of the light emitting surface, the plane direction crossing the thickness direction, wherein both of the first light and the second light output from the light emitting surface.

2. An EL light emitting device of claim 1, the first and the second EL light emitter including organic EL elements.

3. An EL light emitting device of claim 1, the first EL light emitter being in contact with the substrate.

4. An EL light emitting device of claim 1, the second EL light emitter including a member with transparency, the member being in contact with or united with the substrate.

5. An EL light emitting device of claim 4, the second EL light emitter including a pair of organic EL elements, the member being sandwiched there between.

6. An EL light emitting device of claim 1, the second EL light emitter including a mirror that changes a direction of the second light to the planer direction of the light emitting surface.

7. An EL light emitting device of claim 1, wherein the first light and the second light are different in colors.

8. An EL light emitting device, comprising:
    means for emitting a first light;
    means for emitting a second light; and
    means for transmitting and outputting both of the first and second lights,
    the lights entering the means for transmitting and outputting from different directions and being merged and radiating in the same direction,
    the means for emitting a first light being deposited on a substrate, and the means for emitting the first light and the means for emitting the second light including organic EL elements,
    the second light entering the substrate through a side of the substrate.

* * * * *